United States Patent
Hwang

(10) Patent No.: US 7,625,823 B1
(45) Date of Patent: Dec. 1, 2009

(54) METHOD OF PATTERNING A METAL LAYER IN A SEMICONDUCTOR DEVICE

(75) Inventor: Kwang-Jo Hwang, Kyonggi-do (KR)

(73) Assignee: LG Display Co., Ltd., Seoul (KR)

(*) Notice: Subject to any disclaimer, the term of this patent is extended or adjusted under 35 U.S.C. 154(b) by 23 days.

(21) Appl. No.: 09/648,111

(22) Filed: Aug. 25, 2000

(30) Foreign Application Priority Data

Aug. 26, 1999 (KR) ............................... 1999-35739

(51) Int. Cl.
*H01L 21/461* (2006.01)
(52) U.S. Cl. .................... 438/714; 438/710; 438/734; 438/E21.218
(58) Field of Classification Search .................. 438/714, 438/705, 707, 710, 734, E21.218
See application file for complete search history.

(56) References Cited

U.S. PATENT DOCUMENTS

| | | | | |
|---|---|---|---|---|
| 5,286,337 A | * | 2/1994 | Tsou | 156/643 |
| 5,723,366 A | * | 3/1998 | Suzuki et al. | |
| 5,771,110 A | * | 6/1998 | Hirano et al. | 257/72 |
| 5,843,277 A | * | 12/1998 | Goto et al. | 156/643.1 |
| 5,968,847 A | * | 10/1999 | Ye et al. | 437/228 |
| 6,133,145 A | * | 10/2000 | Chen | 438/636 |
| 6,136,723 A | * | 10/2000 | Nagase | 438/725 |
| 6,583,065 B1 | * | 6/2003 | Williams et al. | 438/714 |

FOREIGN PATENT DOCUMENTS

| | | | | |
|---|---|---|---|---|
| JP | 361002368 | * | 1/1986 | 438/FOR. 134 |
| JP | 03-141641 A | | 6/1991 | |
| JP | 408043857 A | * | 2/1996 | |
| KR | 1998-0015324 | | 5/1998 | |

OTHER PUBLICATIONS

M. Mhri et al., Plasma Etching of ITO Thin Films Using a CH4/H2 Gas Mixture, Japanese Journal of Applied Physics, vol. 29, No. 10, Oct. 1990, pp. L 1932-L 1935.*
English language translation of JP361002368.*

* cited by examiner

*Primary Examiner*—Allan R. Wilson
(74) *Attorney, Agent, or Firm*—Birch, Stewart, Kolasch & Birch, LLP

(57) ABSTRACT

In a method of manufacturing a metal pattern, a metal layer is deposited on a passivation layer, and a photoresist pattern is then formed on the metal layer. Using the photoresist pattern as a mask, an exposed portion of the metal layer is treated with a plasma to lower a binding force in the metal. The metal layer is then etched to form a the metal pattern. The method is applicable to the formation of pixel electrodes in LCD devices.

25 Claims, 4 Drawing Sheets

US 7,625,823 B1

METHOD OF PATTERNING A METAL LAYER IN A SEMICONDUCTOR DEVICE

CROSS REFERENCE

This application claims the benefit under 35 U.S.C. § 119 of Korean Patent Application No. 1999-35739, filed on Aug. 26, 1999, the entirety of which is hereby incorporated by reference.

BACKGROUND OF THE INVENTION

1. Field of the Invention

The present invention relates to manufacturing metal patterns in semiconductor devices, and more particularly, to a method of manufacturing such metal patterns. This method is applicable to the manufacture of electrodes in liquid crystal display (LCD) devices.

2. Description of Related Art

A typical LCD device includes first and second transparent substrates with a liquid crystal layer interposed therebetween. The first substrate has a thin film transistor (TFT) as a switching element and a pixel electrode disposed thereon, and the second substrate has a color filter disposed thereon. The pixel electrode serves to apply a voltage to the liquid crystal layer, and the color filter serves to transmit only certain colors of light passing through the liquid crystal.

As shown in FIG. 1, the typical LCD device includes a substrate 1 and a gate electrode 2 formed on the substrate 1. A gate insulating layer 3 covers the whole surface of the substrate 1 and the gate electrode 2. A semiconductor layer 4 is formed over the gate electrode 2. Source and drain electrodes 5 and 6 are formed spaced apart from each other on the gate insulating layer 3 and each overlapping a part of the semiconductor layer 4. A passivation layer 7 is formed on the whole surface of the substrate 1, as well as the source and drain electrodes 5 and 6 and a portion of the semiconductor layer 4. A pixel electrode 9 is formed on the passivation layer 7 and contacts the drain electrode 6 through a contact hole 8 in the passivation layer 7.

FIGS. 2 and 3 illustrate a conventional method of forming the area "II" shown circled in the LCD device of FIG. 1. In order to form the pixel electrode 9, first a metal layer 14 is deposited on the passivation layer 7. The metal layer 14 is made of a transparent conductive material such as indium tin oxide (ITO) or indium zinc oxide (IZO). Subsequently, photoresist is applied on the metal layer 14 and is patterned to form a photoresist pattern 16 shown in FIG. 2. Then, the metal layer 14 is conventionally etched to form the pixel electrode 9 using the photoresist pattern 16 as a mask. Finally, the photoresist pattern 16 is removed.

Conventional techniques for etching the metal layer 14 have the following disadvantages. In case of wet etching techniques, an organic substance such as a photoresist remnant 16a shown in FIG. 3 may be left on the pixel electrode 9 and the passivation layer 7. This is due to heat generated during the photolithography process. Also, pin holes and cracks may develop in the metal layer 14 when wet etching. Further, the gate electrode 2 and the connecting gate line (not shown) may become open due to the wet etchant. Because wet etching causes the problems of low yields and line defects, dry etching techniques have also been conventionally used for etching.

In case of dry etching techniques, the etch rate is typically low, so that the array substrate is subjected to radio frequency (RF) power for a long time. The photoresist pattern may be damaged by maintaining the array substrate at a high temperature. As a result, the photoresist pattern is not easy to remove, leading to a high defect rate. Further, if the RF power is increased to improve the etch rate, the temperature of the array substrate becomes greater, leading to the photoresist problem described above. For example, as illustrated in FIG. 4, the RF power curve 22 of 2000 watts causes the substrate temperature to increase at a greater rate than the RF power curve 20 of 1500 watts.

SUMMARY OF THE INVENTION

Accordingly, the present invention is directed to a method of patterning a metal layer in a semiconductor device that substantially obviates one or more of the problems due to limitations and disadvantages of the related art.

In accordance with the purpose of the invention, as embodied and broadly described, in one aspect the invention includes a method of patterning a metal layer, including depositing a metal layer over a substrate; forming a mask on the metal layer, leaving a portion of the metal layer uncovered; exposing the uncovered portion of the metal layer to a first plasma to lower a binding force in the uncovered portion; and removing the uncovered portion of the metal layer with a second plasma to form a metal pattern.

In another aspect, the invention includes a method of manufacturing a pixel electrode in a liquid crystal display device, including depositing a metal layer on a passivation layer which partially covers a transistor; forming a photoresist pattern on the metal layer, leaving a portion of the metal layer uncovered; exposing the uncovered portion of the metal layer to a first plasma to lower a binding force in the uncovered portion; and removing the uncovered portion of the metal layer with a second plasma to form a pixel electrode.

In still another aspect, the invention includes a method of manufacturing a liquid crystal display device, including forming a switching element on a substrate; forming a passivation layer over the substrate; depositing a metal layer on the passivation layer; forming a photoresist pattern on the metal layer, such that a portion of the metal layer is exposed; treating the exposed portion of the metal layer with a plasma using the photoresist pattern as a mask; and removing the treated portion of the metal layer to form a pixel electrode.

Using the method of manufacturing according to the present invention, semiconductor devices (e.g., LCD devices) having advantageously high yields may be obtained.

It is to be understood that both the foregoing general description and the following detailed description are exemplary and explanatory and are intended to provide further explanation of the invention as claimed.

The accompanying drawings are included to provide a further understanding of the invention and are incorporated in and constitute a part of this specification, illustrate one embodiment of the invention and together with the description serve to explain the principles of the invention.

BRIEF DESCRIPTION OF THE DRAWINGS

For a more complete understanding of the present invention and the advantages thereof, reference is now made to the following descriptions taken in conjunction with the accompanying drawings.

DETAILED DESCRIPTION OF PREFERRED EMBODIMENTS

Reference will now be made in detail to a preferred embodiment of the present invention, example of which is illustrated in the accompanying drawings.

Figure 1:
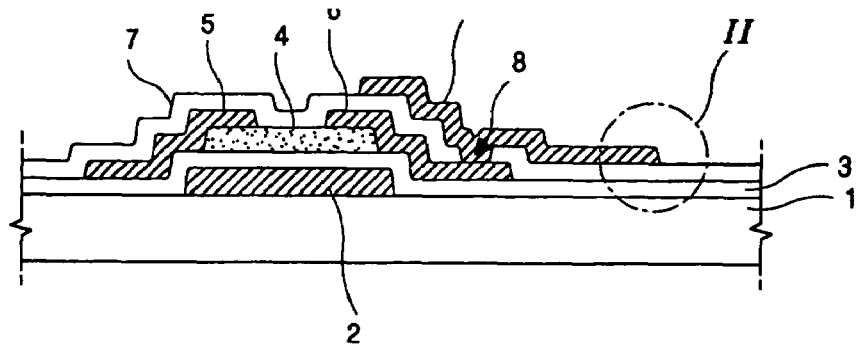
FIG. 1 is a cross sectional view illustrating a conventional LCD device.
Figure 2:
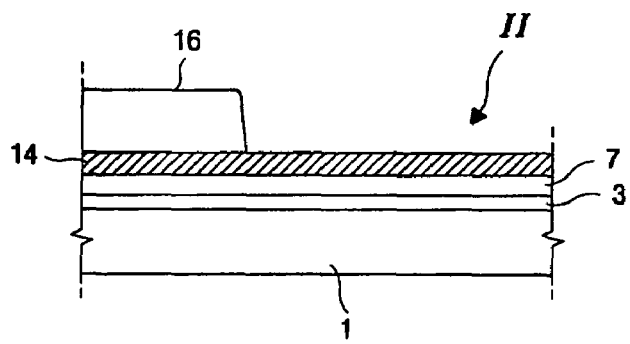
FIGS. 2 and 3 are enlarged cross sectional views illustrating a method of manufacturing a pixel electrode in a portion "II" of the conventional LCD device in FIG. 1.
Figure 3:
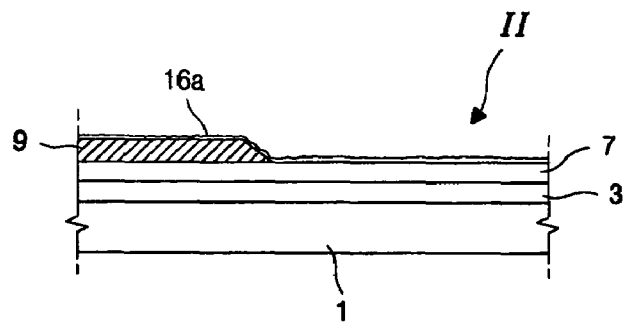
Figure 4:
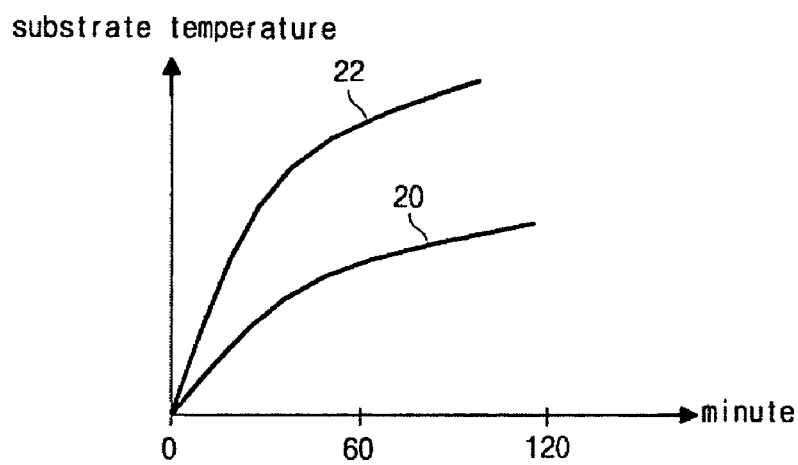
FIG. 4 is an exemplary graph illustrating the temperature of the substrate in relation to a dry etching processing time.
Figure 5:
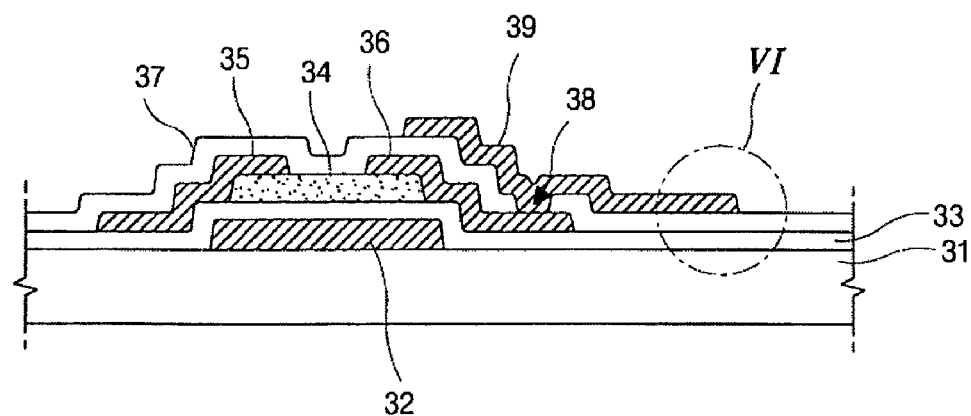
FIG. 5 is a cross sectional view illustrating an LCD device manufactured according to a preferred embodiment of the present invention.

FIG. 5 is a cross sectional view illustrating an LCD device manufactured according to a preferred embodiment of the present invention. As shown in FIG. 5, the inventive LCD device includes a substrate 31 and a gate electrode 32 formed on the substrate 31. A gate insulating layer 33 covers the whole surface of the substrate 31 and the gate electrode 32. A semiconductor layer 34 is formed over the gate electrode 32. Source and drain electrodes 35 and 36 are formed spaced apart from each other on the gate insulating layer 33 and each overlapping a part of the semiconductor layer 34. A passivation layer 37 is formed on the whole surface of the substrate 31, as well as the source and drain electrodes 35 and 36 and a portion of the semiconductor layer 34. A pixel electrode 39 is formed on the passivation layer 37 and contacts the drain electrode 36 through a contact hole 38 in the passivation layer 37. There is no organic material remaining on the pixel electrode 39 or on the adjacent passivation layer 37 from the device's manufacturing process.

Figure 6A:
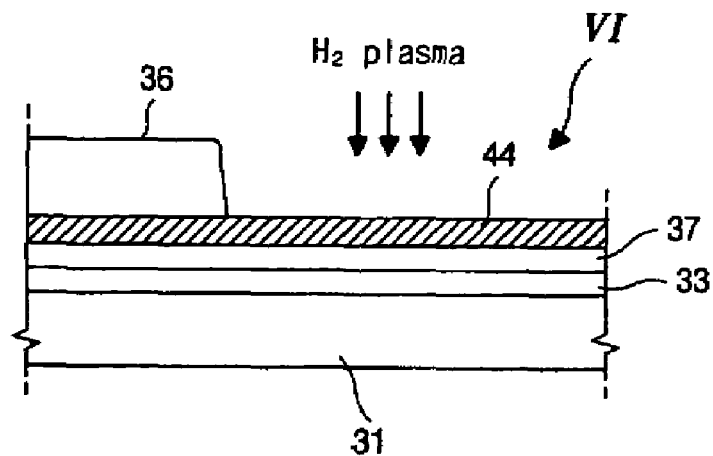
FIGS. 6A and 6B are enlarged cross sectional views illustrating a method of manufacturing a pixel electrode in a portion "VI" of the LCD device in FIG. 5.
Figure 6B:
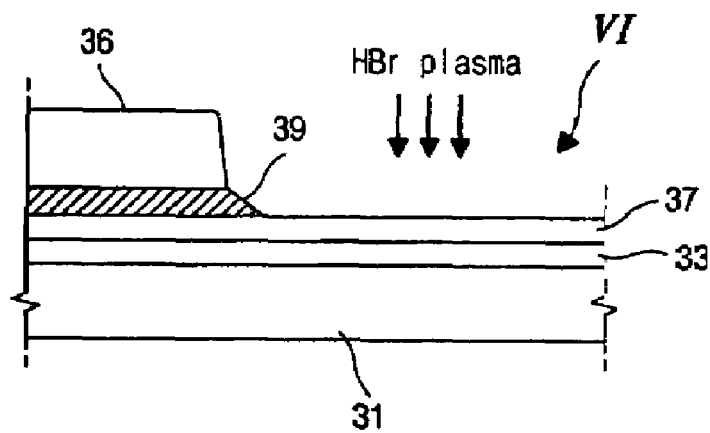

FIGS. 6A and 6B illustrate a method of manufacturing a pixel electrode in the area "VI" shown circled in the LCD device of FIG. 5. As shown in FIG. 6A, first a metal layer 44 is deposited on the passivation layer 37. The metal layer 44 is made of indium tin oxide (ITO) and the passivation layer is made of a silicon nitride (SiNx) film. In an alternate embodiment, the metal layer 44 may be made of indium zinc oxide (IZO). Subsequently a photoresist is applied on the metal layer 44 and patterned to form a photoresist pattern 36.

Then, the exposed surface of the metal layer 44 is plasma-treated by the reactive gas such as $H_2$ plasma gas using the photoresist pattern 36 as a mask. Also, a non-reactive gas such as Ar or $N_2$ plasma gas can be used for the plasma treatment. When using the $H_2$ plasma gas, the composition of the metal layer 44 is varied so that the binding force of the metal layer 44 becomes depressed. In particular, the $H_2$ gas reacts with oxygen in the ITO layer 44, so that $H_2O$ is formed and only indium metal remains. The binding force of the remaining indium metal is lower, and the metal is correspondingly easier to etch. When using the non-reactive gas, such as the Ar or $N_2$ plasma gas, the binding force of the surface of the metal layer 44 becomes depressed physically. In particular, Ar or $N_2$ ions physically strike the surface of the metal layer 44, thereby breaking chemical bonds and lowering the overall binding force of the metal layer. This lower binding force of the metal layer 44 causes the high etch rate in subsequent processing.

Subsequently, as shown in FIG. 6B, the metal layer 44 is plasma-etched to form the pixel electrode 39 using hydrogen bromide (HBr) plasma gas. Other plasma gasses, such as those mentioned with respect to FIG. 7, may be used to etch the metal layer 44. The present invention has an etch rate twice as high as the conventional art under similar conditions where the same RF power is applied.

Figure 7:
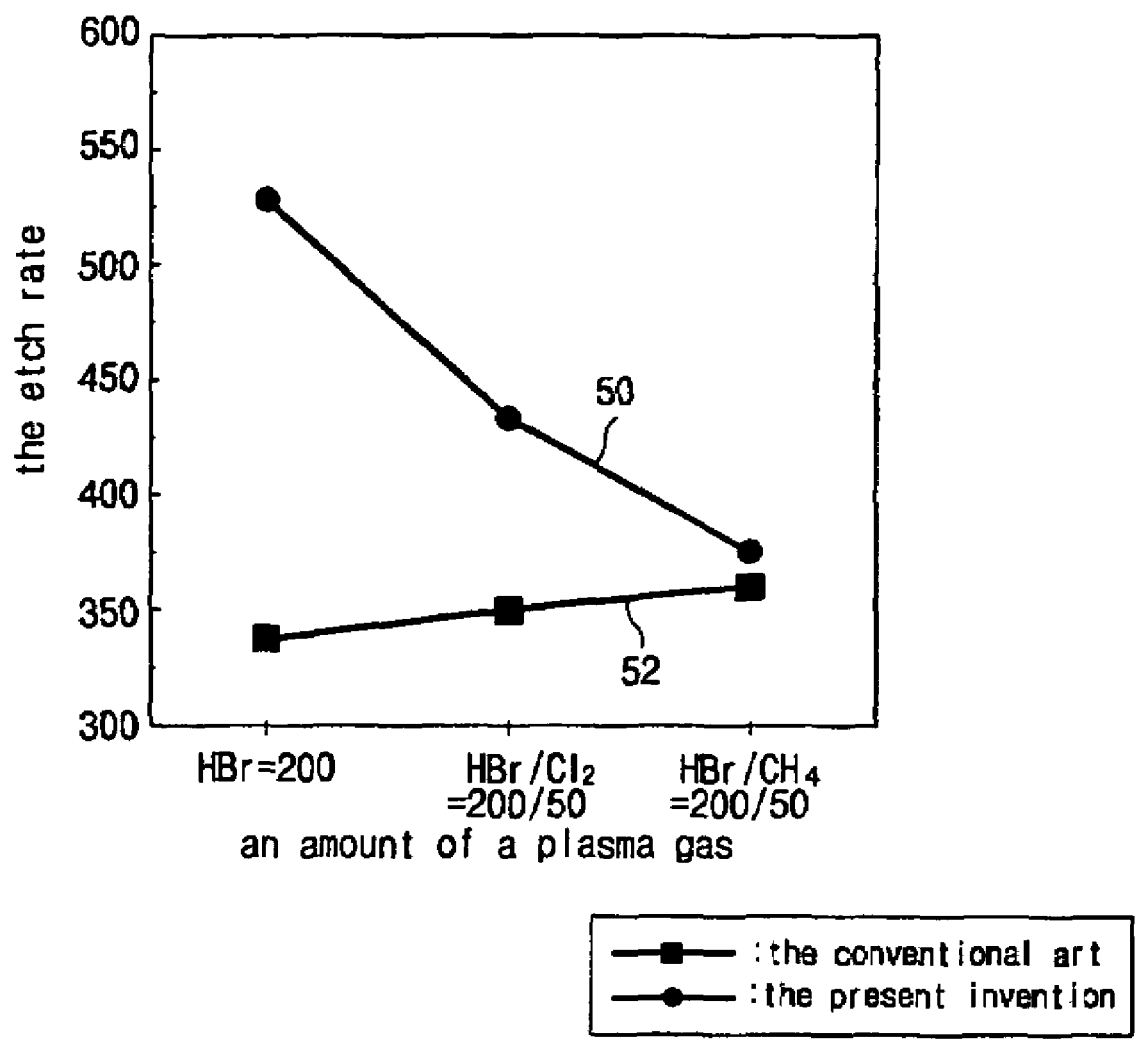
FIG. 7 is a graph illustrating an etch rate of an amount of plasma gas according to the preferred embodiment of the present invention, and an etch rate according to the conventional art for comparison.

FIG. 7 is a graph illustrating the etch rates according to the preferred embodiment of the present invention, and according to the conventional art for comparison purposes. The horizontal axis indicates the amount of the plasma gas composition whose unit is a standard cubic per centimeter (SCCM), and the vertical axis indicates the etch rate of the metal layer (Å/min). A curve 50 denotes the etch rate of the metal layer 44 according to the preferred embodiment of the present invention, and a curve 52 denotes the etch rate of the metal layer 44 according to the conventional art.

As shown in FIG. 7, when etching the metal layer 44 using HBr plasma gas of 200 SCCM, the etch rate according to the present invention is about twice as high as that according to the conventional art. When etching the metal layer 44 using a compound of the HBr plasma gas and $Cl_2$ plasma gas whose mixing ratio is 200:50, the present invention has an etch rate about 100 Å/min higher than the conventional art method. When etching the metal layer 44 using a compound of the HBr plasma gas and $CH_4$ plasma gas whose mixing ratio is 200:50, the etch rate according to the present invention is higher than the conventional art, though the improvement in the etch rate is smaller than with other plasma compounds.

As described herein, using the method of manufacturing metal patterns according to the preferred embodiment of the present invention, semiconductor devices (e.g., LCD devices) having high manufacturing yields can be obtained.

While the invention has been particularly shown and described with reference to preferred embodiments thereof, it will be understood by those skilled in the art that the foregoing and other changes in form and details may be made therein without departing from the spirit and scope of the invention. For example, although the method of patterning a metal layer according to the invention has been primarily described with respect to a pixel electrode in an LCD device, this method is also generally applicable to forming metal patterns of other geometries and uses in semiconductor devices. The invention described above is therefore not intended to be limited to LCD devices, but rather encompasses all metal patterns so formed with easier removal of the metal layer and faster processing time. Thus, it is intended that the present invention cover the modifications and variations of the this invention provided that they come within the scope of the appended claims and their equivalents.

What is claimed is:

1. A method of manufacturing a liquid crystal display device, comprising:

forming a switching element on a substrate;

forming a passivation layer over the substrate;

depositing a metal layer on the passivation layer;

forming a photoresist pattern on a surface of the metal layer, such that an upper portion of said metal layer is exposed;

treating the exposed portion of said metal layer with a first plasma, prior to any step of etching said photoresist pattern, and prior to any step of etching said metal layer, to increase a subsequent etch rate of said metal layer by lowering an internal binding force in the exposed portion of said metal layer; and etching the treated portion of said metal layer to form a pixel electrode, wherein said depositing a metal layer on the passivation layer, forming a photoresist pattern, and treating the exposed portion of said metal layer are sequentially performed.

2. The method of claim 1, wherein the switching element is a thin film transistor.

3. The method of claim 1, wherein the step of treating the exposed portion of the metal layer includes,
 using a reactive gas to lower a binding force in the exposed portion.

4. The method of claim 3, wherein the reactive gas includes $H_2$ plasma gas.

5. The method of claim 1, wherein the step of treating the exposed portion of the metal layer includes,
 using a non-reactive gas to lower a binding force in the exposed portion.

6. The method of claim 5, wherein the non-reactive gas includes Ar or $N_2$ plasma gas.

7. The method of claim 1, wherein the step of etching the metal layer involves a dry-etching technique.

8. The method of claim 1, wherein the metal layer includes one of indium tin oxide (ITO) and indium zinc oxide (IZO).

9. The method of manufacturing a liquid crystal display device of claim 1, wherein the step of etching the metal layer includes etching the metal layer with a composition of HBr plasma gas and Cl2 plasma gas or with a composition of HBr plasma gas and CH4 plasma gas, and the composition of HBr plasma gas and $CH_4$ plasma gas has a mixing ratio of approximately 200:50 or the composition of HBr plasma gas and $CL_2$ plasma gas has a mixing ratio of approximately 200:50.

10. A method of patterning a metal layer, comprising:
 depositing a metal layer over a substrate;
 forming a mask on a surface of the metal layer, leaving an upper portion of said metal layer uncovered;
 exposing the uncovered portion of said metal layer to a first plasma, prior to any step of etching said metal layer, to increase a subsequent etch rate of said metal layer by lowering an internal binding force in the uncovered portion to increase a subsequent etch rate of said metal layer; and
 etching the uncovered portion of said metal layer with a second plasma to form a metal pattern, wherein said depositing a metal layer over a substrate, forming a mask on a surface of the metal layer, and exposing the uncovered portion of said metal layer are sequentially performed.

11. The method of claim 10, wherein the first plasma includes $H_2$ plasma gas.

12. The method of claim 10, wherein the first plasma includes Ar or $N_2$ plasma gas.

13. The method of claim 10, wherein the metal layer includes one of indium tin oxide (ITO) and indium zinc oxide (IZO).

14. The method of claim 10, wherein the metal pattern includes a pixel electrode of a display device.

15. The method of patterning a metal layer of claim 10, wherein the second plasma includes a composition of HBr plasma gas and $CH_4$ plasma gas which has a mixing ratio of approximately 200:50 or the composition of HBr plasma gas and $CL_2$ plasma gas has a mixing ratio of approximately 200:50.

16. A method of manufacturing a pixel electrode in a liquid crystal display device, comprising:
 depositing a metal layer on a passivation layer which partially covers a transistor;
 forming a photoresist pattern on a surface of the metal layer, leaving an upper portion of the metal layer uncovered;
 exposing the uncovered portion of said metal layer to at least one first gas, prior to any step of etching said photoresist pattern and prior to any step of etching said metal layer, to lower an internal binding force in the uncovered portion to increase a subsequent etch rate of said metal layer; and
 etching the uncovered portion of said metal layer with at least one second gas to form a pixel electrode, wherein said depositing a metal layer on the passivation layer, forming a photoresist pattern, and exposing the uncovered portion of said metal layer are sequentially performed.

17. The method of claim 16, wherein the first gas is a reactive gas.

18. The method of claim 17, wherein the reactive gas includes $H_2$ plasma gas.

19. The method of claim 16, wherein the first gas is a non-reactive gas.

20. The method of claim 19, wherein the non-reactive gas includes Ar or $N_2$ plasma gas.

21. The method of claim 16, wherein the metal layer includes one of indium tin oxide (ITO) and indium zinc oxide (IZO).

22. The method of claim 16, further comprising:
 removing the photoresist pattern from the pixel electrode.

23. The method of manufacturing a pixel electrode in a liquid crystal display device of claim 16, wherein the second plasma includes a composition of HBr plasma gas and $Cl_2$ plasma gas which has a mixing ratio of approximately 200:50 or the composition of HBr and $CH_4$ plasma gas has a mixing ratio of approximately 200:50.

24. A method of manufacturing a pixel electrode in a liquid crystal display device, comprising:
 depositing a metal layer on a passivation layer which partially covers a transistor;
 forming a photoresist pattern on a surface of the metal layer, leaving an upper portion of the metal layer uncovered;
 exposing the uncovered portion of said metal layer to at least one first gas, prior to any step of etching, to lower an internal binding force in the uncovered portion to increase a subsequent etch rate of said metal layer; and
 etching the uncovered portion of said metal layer with at least one second gas to form a pixel electrode, wherein said depositing a metal layer on the passivation layer, forming a photoresist pattern, and exposing the uncovered portion of said metal layer are sequentially performed,
 wherein the second gas includes a composition of HBr plasma gas and $Cl_2$ plasma gas or a composition of HBr plasma gas and $CH_4$ plasma gas.

25. The method of manufacturing a pixel electrode in a liquid crystal display device of claim 24, wherein the composition of HBr plasma gas and $Cl_2$ plasma gas has a mixing ratio of approximately 200:50 or the composition of HBr plasma gas and $CH_4$ plasma gas has a mixing ratio of approximately 200:50.

* * * * *